US010956263B2

United States Patent
Kumar et al.

(10) Patent No.: US 10,956,263 B2
(45) Date of Patent: Mar. 23, 2021

(54) MEMORY SYSTEM WITH DEEP LEARNING BASED INTERFERENCE CORRECTION CAPABILITY AND METHOD OF OPERATING SUCH MEMORY SYSTEM

(71) Applicant: SK hynix Inc., Gyeonggi-do (KR)

(72) Inventors: Naveen Kumar, San Jose, CA (US); Aman Bhatia, San Jose, CA (US); Yu Cai, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/400,807

(22) Filed: May 1, 2019

(65) Prior Publication Data

US 2019/0340069 A1  Nov. 7, 2019

Related U.S. Application Data

(60) Provisional application No. 62/666,373, filed on May 3, 2018.

(51) Int. Cl.
*G06F 11/10* (2006.01)
*G11C 29/52* (2006.01)
(Continued)

(52) U.S. Cl.
CPC ......... *G06F 11/1068* (2013.01); *G06N 20/00* (2019.01); *G11C 29/52* (2013.01);
(Continued)

(58) Field of Classification Search
CPC ............. G06F 11/1004; G06F 11/1012; G06F 11/1048; G11C 11/5642; G11C 11/5671;
(Continued)

(56) References Cited

U.S. PATENT DOCUMENTS 9,450,610 B1 * 9/2016 Micheloni ........... G06F 11/1012
10,601,546 B2   3/2020 Kumar et al.
(Continued)

OTHER PUBLICATIONS

N. Kanistras, I. Tsatsaragkos and V. Paliouras, "Propagation of LLR Saturation and Quantization Error in LDPC Min-Sum Iterative Decoding," 2012 IEEE Workshop on Signal Processing Systems, Quebec City, QC, 2012, pp. 276-281 (Year: 2012).*

(Continued)

*Primary Examiner* — Cynthia Britt
(74) *Attorney, Agent, or Firm* — IP & T Group LLP

(57) ABSTRACT

Memory systems, controllers, decoders and methods execute decoding with a mufti-level interference correction scheme. A decoder performs first soft decoding to generate log likelihood ratio (LLR) values of a select bit and bits of memory cells neighboring a memory cell of the select bit. A quantizer obtains an estimated LLR value of the select bit based on the LLR values of the select bit and the bits of the memory cells neighboring the memory cell of the select bit, when the first soft decoding fails. The decoder performs second soft decoding using the estimated LLR value when the first soft decoding fails, and performs third soft decoding using information obtained from application of a deep learning model to provide a more accurate estimate of the LLR value of the select bit when the second soft decoding fails.

19 Claims, 6 Drawing Sheets

(51) Int. Cl.
*G06N 20/00* (2019.01)
*H03M 13/11* (2006.01)
*H03M 13/45* (2006.01)

(52) U.S. Cl.
CPC .... *H03M 13/1102* (2013.01); *H03M 13/1108* (2013.01); *H03M 13/1111* (2013.01); *H03M 13/45* (2013.01)

(58) Field of Classification Search
CPC . G11C 16/26; G11C 16/08; G11C 2211/5642; G11C 16/3422; G11C 16/0483; H03M 13/45
See application file for complete search history.

(56) References Cited

U.S. PATENT DOCUMENTS

| | | | |
|---|---|---|---|
| 2006/0168500 A1* | 7/2006 | Whinnett | H04L 1/005 714/794 |
| 2007/0210941 A1 | 9/2007 | Park et al. | |
| 2011/0205823 A1* | 8/2011 | Hemink | G11C 16/26 365/211 |
| 2011/0305082 A1* | 12/2011 | Haratsch | G11C 7/04 365/185.03 |
| 2016/0087757 A1 | 3/2016 | Nekuii | |
| 2018/0034485 A1* | 2/2018 | Marelli | G11C 16/3422 |
| 2018/0357530 A1* | 12/2018 | Beery | G06N 3/0454 |

OTHER PUBLICATIONS

J. Zhang, M. A. Armand and P. Y. Kam, "A Mutual Information Approach for Comparing LLR Metrics for Iterative Decoders," 2009 IEEE International Conference on Communications, Dresden, 2009, pp. 1-5. (Year: 2009).*

L. Kong, J. Li, P. Chen and S. Zhang, "Protograph QC-LDPC codes design for multi-level cell flash memories," 2017 9th International Conference on Wireless Communications and Signal Processing (WCSP), Nanjing, 2017, pp. 1-5. (Year: 2017).*

* cited by examiner

MEMORY SYSTEM WITH DEEP LEARNING BASED INTERFERENCE CORRECTION CAPABILITY AND METHOD OF OPERATING SUCH MEMORY SYSTEM

CROSS-REFERENCE TO RELATED APPLICATION

This application claims the benefit of U.S. Provisional Application No. 62/666,373, filed May 3, 2018, the entire content of which is incorporated herein by reference.

BACKGROUND

1. Field

Embodiments of the present disclosure relate to a memory system and components thereof capable of predicting corrections in decoding, and method of operating such memory system.

2. Description of the Related Art

The computer environment paradigm has shifted to ubiquitous computing systems that can be used anytime and anywhere. As a result, the use of portable electronic devices, such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data. LDPC codes are a class of linear block codes, which are represented by a parity-check matrix that contains only a few compared to the number of U's. Both hard and soft decision decoding algorithms (hard and soft decoders) may be applied to LDPC codes. A soft LDPC decoder uses information that represents bit decision reliability, e.g., log-likelihood ratio (LLR).

In this context embodiments of the present invention arise.

SUMMARY

Aspects of the present invention include memory controllers and decoders. In one aspect, a memory controller comprises a decoder to perform first soft decoding to generate log-likelihood ratio (LLR) values of a select bit and bits of memory cells neighboring a memory cell of the select bit; and a qua tizer to obtain an estimated LLR value of the select bit based on the LLR values of the select bit and the bits of the neighboring memory cells when the first soft decoding fails. The decoder is further configured to perform second soft decoding using the estimated LLR value when the first soft decoding fails, and to perform third soft decoding using information obtained from application of a deep learning model to provide a more accurate estimate of the LLR value of the select bit when the second soft decoding fails.

Another aspect of the present invention includes a memory system comprising a memory device including a memory cell array of memory cells formed at the intersections of bit lines and word lines; and a memory controller, which comprises a decoder configured to perform different levels of soft decoding of a codeword of bits, and a quantizer to obtain an estimated log-likelihood ratio (LLR) values, including obtaining an estimated LLR value of a select bit and the bits of the memory cells neighboring the memory cell of the select bit when first, unenhanced soft decoding fails. The decoder is further configured to perform second soft decoding using the estimated LLR value, when the first soft decoding fails. When the second soft decoding fails, the decoder performs third soft decoding using information obtained from application of a deep learning model to provide a more accurate estimate of the LLR value of the select bit.

Further aspects of the present invention include methods of decoding, which may be performed by memory controllers and components thereof, such as decoders. In this regard, another aspect of the present invention, entails a method of decoding. The method generally comprises performing first soft decoding of a codeword to generate log-likelihood ratio (LLR) values of a select bit and bits of memory cells neighboring a memory cell of the select bit; applying interference correction to obtain an estimated LLR value of the select bit using information on the bits of the memory cells neighboring the memory cell of the select bit obtained during the first soft decoding, when the first soft decoding fails; performing second soft decoding of the codeword using the estimated LLR value obtained by applying interference correction; applying a deep learning model to provide a more accurate estimate of the LLR value of the select bit when the second decoding fails; and performing third soft decoding of the codeword using the more accurate estimated LLR value of the select bit obtained by applying the deep learning model.

Additional aspects of the present invention will become apparent from the following description.

DETAILED DESCRIPTION

Figure 1:
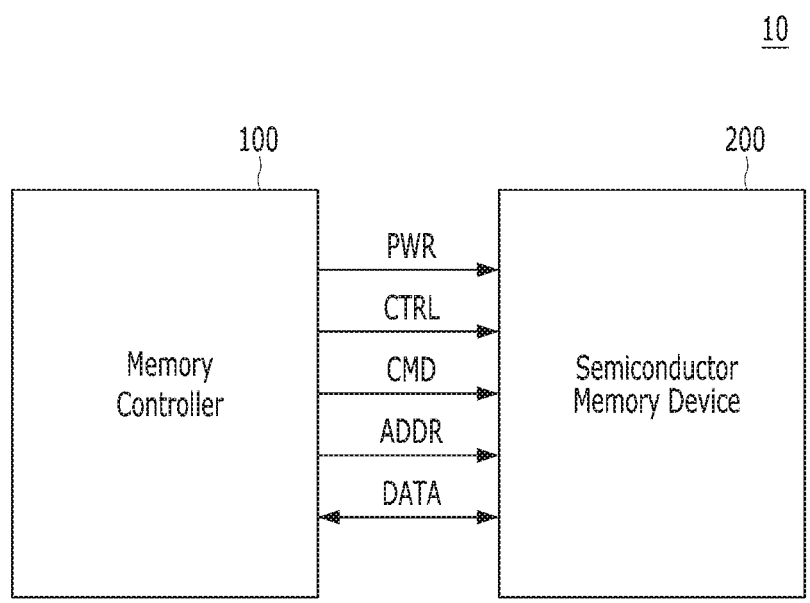
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type. For brevity, semiconductor memory device 200 is sometimes simply referred to as memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDRC) card, and/or a universal flash storage (UFS).

In another embodiment, the memory system 10 may be provided as one of various components in an electronic device, such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
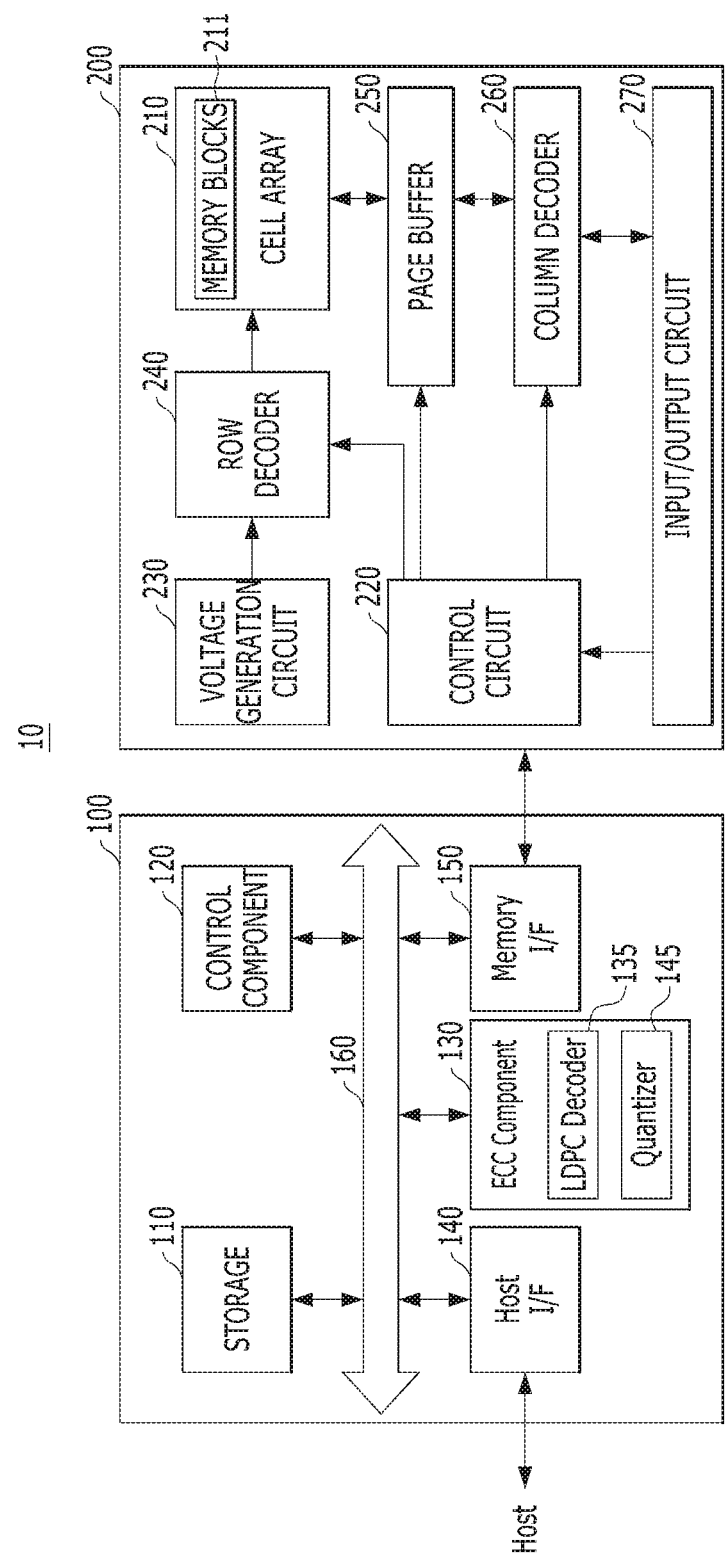
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device, such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device, such as a mobile phone, a smart phone, an e-book, an MP3 player, a portable multimedia player (PMP), and/or a portable game player.

The semiconductor memory device 200 may store data to be accessed by the host device.

The semiconductor memory device 200 may be implemented with a volatile memory device, such as a dynamic random access memory (DRAM) and/or a static random access memory (SRAM) or a non-volatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor, e.g., a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations, such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation, such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), and a block coded modulation (BCM). LDPC codes are of particular relevance to embodiments of the present invention. Thus, the ECC component 130 may include any and all circuits, systems or devices for suitable error correction operation, including detecting and correcting errors in LDPC codes, in accordance with embodiments of the present invention.

In particular, in embodiments of the present invention, the ECC component 130 includes an LDPC decoder 135 and a quantizer 145. The operation of these components are explained in more detail below.

The host interface 140 may communicate with the host device through one or more of various interface protocols, such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The semiconductor memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
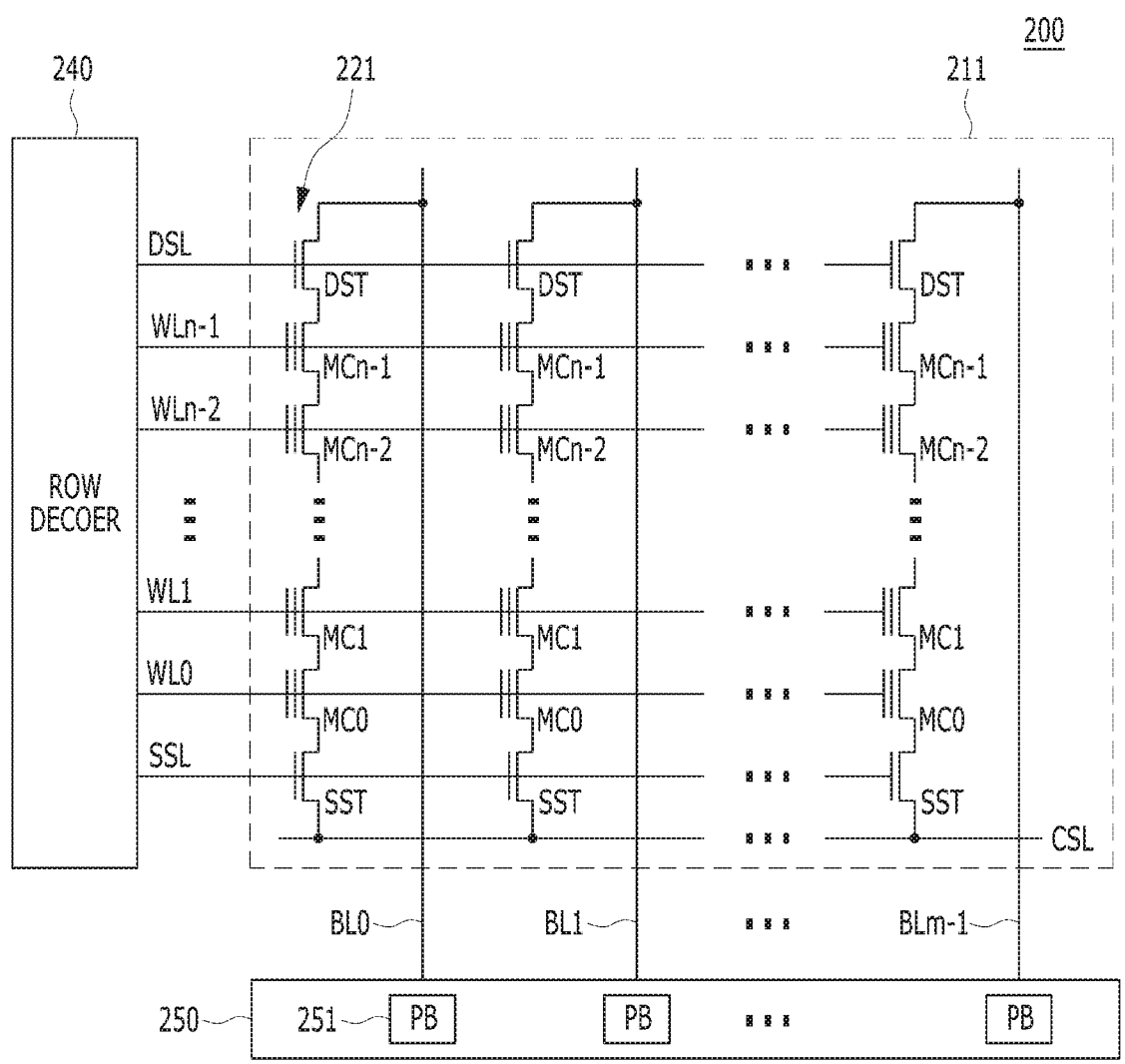
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a mufti-level cell (MLC) storing data information of multiple bits.

The memory cells may be arranged at respective intersections between the bit lines BL and word lines WL. In decoding data read from a particular memory cell, data in neighboring memory cells on neighboring word lines and bit lines may interfere with such decoding. Embodiments of the present invention are directed to removing or minimizing such interference as explained further below.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
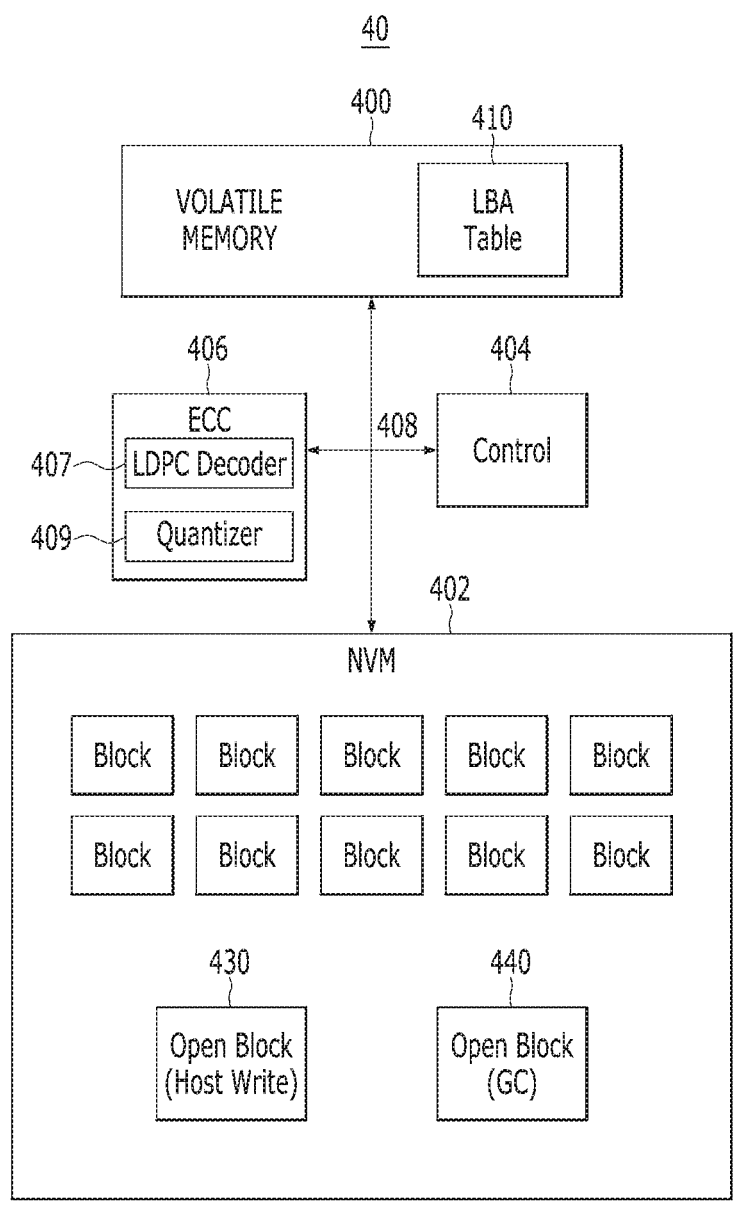
FIG. 4 is a schematic diagram of a memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address (LBA) table 410 for mapping physical-to-logical addresses of bits. The NVM 402 may include a plurality of memory blocks, as well as an open block for host writes 430 and an open block for garbage collection (GC) 440. Multiple memory blocks may be grouped together as a super block for certain functional purposes.

The ECC module 406 may include an LDPC decoder 407 and a quantizer 409, which may correspond to the LDPC decoder 135 and quantizer 145 respectively in FIG. 2. The ECC module 406 including its LDPC decoder 407 and quantizer 409 may be used to carry out aspects of the present invention. For ease of presentation, however, the description below sometimes refers simply to LDPC decoder 135 and quantizer 145. Additional/alternative components that may be utilized with memory systems to effectuate the present invention will be understood to those of skill in the art in light of this disclosure.

In the context of decoding LDPC codes, aspects of the present invention are directed to removing the effect of interference of neighboring word lines and bit lines, particularly when the interference is non-linear. To that end, embodiments of the present invention provide a deep learning based channel model that is capable of predicting correction based on bit line and word line data. In one aspect, to remove neighboring interference and to predict log-likelihood ratio (LLR) values, each of which represents reliability of the value for the corresponding bit, mutual information is maximized to obtain an optimal quantizer.

In accordance with an embodiment of the present invention, the quantizer 145 is optimally configured to provide a quantized LLR value of a desired bit using information from cells surrounding or neighboring the cell of the desired bit, as well as bit information observed from the channel, following failed regular, i.e., unenhanced, LDPC soft decoding. LDPC soft decoding is then performed again after interference correction using the information obtained from such correction. If and when that enhanced LDPC soft decoding fails, a deep learning framework trained on failed bits using neighbor information as well as LDPC information is used to predict LLR more accurately. Further enhanced LDPC soft decoding is then performed again using information obtained from the deep learning. Additional details of this decoding scheme with multi-level interference correction capability are described below.

The following notations are used in describing aspects of the present invention.

The channel model for interference observed in NAND data is denoted as follows:

$$ELLR_k^N = \mathcal{F}(LLR_{k-1}^{N-1}, LLR_k^{N-1}, LLR_{k+1}^{N-1},$$
$$LLR_{k-1}^{N}, LLR_k^{N}, LLR_{k+1}^{N}, LLR_{k-1}^{N+1}, LLR_k^{N+1},$$
$$LLR_{k+1}^{N+1}) \qquad (1).$$

Here, $ELLR_k^N$ is the estimated LLR for the kth bit (of the kth bit line) and Nth word line, and the LLRs in the bracket are the LLRs read from respective neighboring cells in the memory device 200, where the superscript denotes the word line and the subscript denotes the bit (or bit line). For example, $ELLR_{k-1}^{N-1}$ is the LLR for the (k−1)th bit and the (N−1)th word line. $\mathcal{F}$ is a nonlinear function that may be determined heuristically. That is, a more accurate LLR is estimated for the kth bit based on the current LLR for the kth bit, as well as the current LLRs for the bits of all eight neighboring word line, bit line intersections.

$\overline{X^k}$ denotes an input feature space. $\overline{X^k} = [\overline{X_1^k}, \overline{X_2^k}]$, where $\overline{X_1^k} = [LLR_{k-1}^{N-1}, LLR_k^{N-1}, LLR_{k+1}^{N-1}, LLR_{k-1}^{N}, LLR_k^{N}, LLR_{k+N}, LLR_{k-1}^{N+1}, LLR_k^{N+1}, LLR_{k+1}^{N+1}]$, and $\overline{X_2^k}$ contains LDPC code information for the kth bit, e.g., number of unsatisfied checks connected to the kth bit, degree of the kth bit, LLRs received from all checks connected to the kth bit during an LDPC decoding iteration, and LDPC decoding iteration number. Note that the information of $\overline{X_2^k}$ is not limited to these features; additional and/or alternate relevant information can be included based on the specific problem of interest.

$\overline{Y^k}$ denotes the estimated LLR value obtained from the developed model (θ) which takes $\overline{X^k}$ as an input.

$B_k$ denotes the correct input value for the kth bit, which can be 0 or 1.

Thus, one representation of the issue at hand may be formulated as follows:

$$\hat{\theta} = \text{argmax}_\theta I(B_k, \overline{Y^k}) \qquad (2).$$

Here, I denotes mutual information between $B_k$ and $\overline{Y^k}$. The model ($\hat{\theta}$), which takes $\overline{X^k}$ as an input, as defined in (2), may be solved as follows:

First, the following problem of finding an optimal quantizer ($\widehat{Q_1}$) from $\overline{X_1^k}$, represented by $\widehat{Q_1} = \text{argmax}_{Q_1} I(B_k, \overline{Y_1^k})$ (3), is solved.

The range of $\overline{Y_1^k}$ is based on the desired quantized values used for the LDPC decoder 135. For example, if the LDPC decoder 135 uses 4 bit LLR values, $\overline{Y_1^k}$ can take any of 16 values. Problem (3) can be solved, and in so doing, configure the quantizer 145, represented by $\widehat{Q_1}$ in (3), to quantize $\overline{X_1^k}$ values to $\overline{Y_1^k}$ values.

Values of $\overline{Y_1^k}$ are fed into the LDPC decoder 135 for regular decoding. If the LDPC decoder 135 gets stuck, a recovery procedure can be used. For the recovery procedure, a deep learning (DL) model ($\widehat{\theta_2}$) is used, which can provide an output $Y_2^k$ with inputs $^i\overline{X^k}$, where $^i\overline{X^k}$ denote inputs at the ith LDPC iteration. The DL model ($\widehat{\theta_2}$) cab be expressed as follows.

$$\widehat{\theta_2} = \text{argmin}_{\theta_2} H(GLLR_k, \overline{Y_k^k}) \qquad (4)$$

Here, H denotes cross-entropy and $GLLR_k$ denotes genie LLR for the kth bit. It should be noted that input of the DL model ($\widehat{\theta_2}$) takes neighboring word line and bit line information as well as LDPC decoder information to predict LLR more accurately. Training of the DL model may be done on failed codewords after LDPC decoding.

Figure 5:
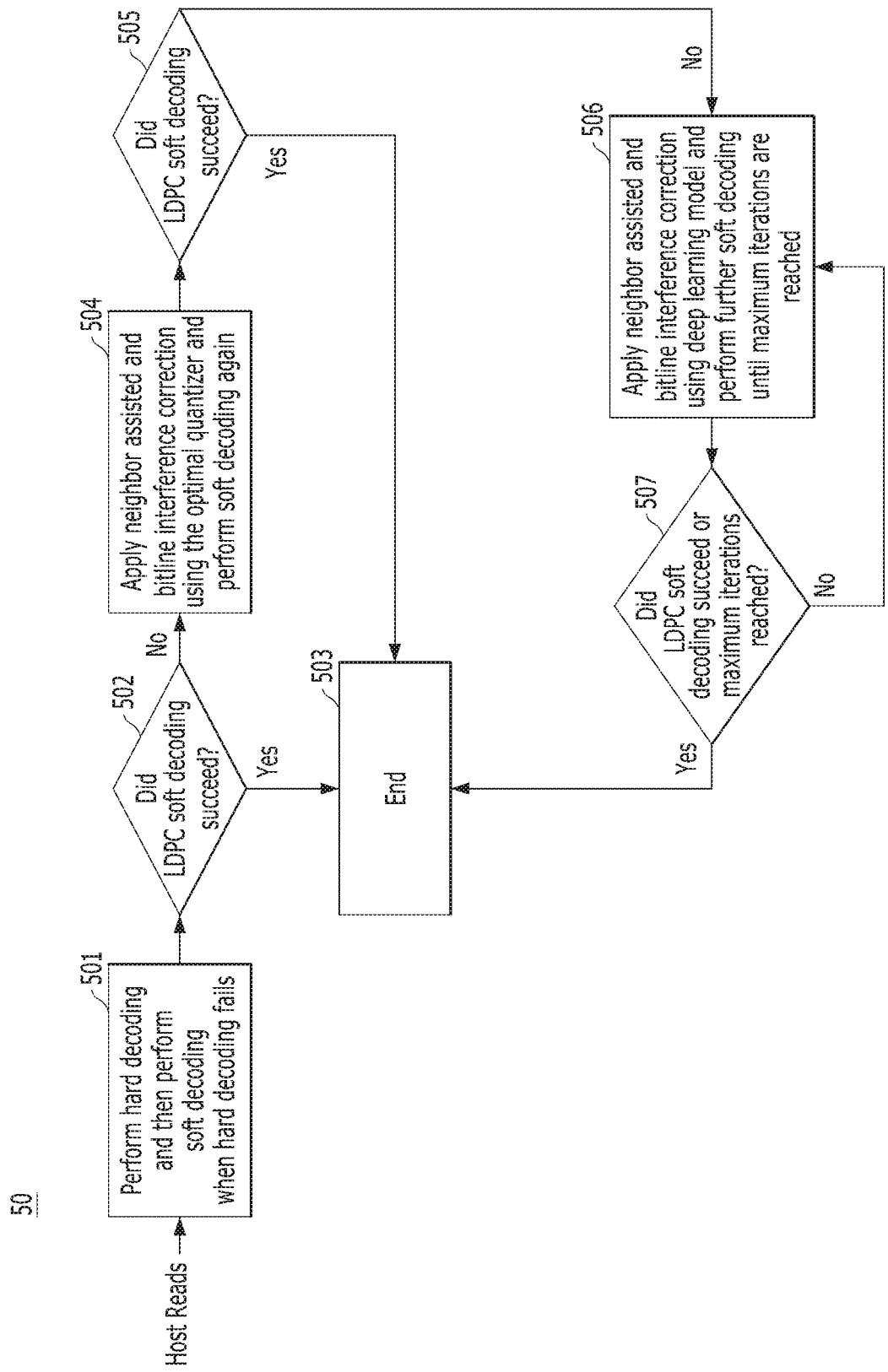
FIG. 5 is a flow chart illustrating interference cancellation processing in accordance with an embodiment of the present invention.

FIG. 5 shows a flow 50 for LDPC decoding with interference cancellation using an optimized quantizer and the DL model, in accordance with embodiments of the present invention. The operations of the flow 50 may be performed by the LDPC decoder 135/407 and the quantizer 145/409 within the ECC component 130 or ECC module 406 respectively, and may operate in conjunction with other components of the memory controller 100. The LDPC decoder 135/407 and the quantizer 145/409 may be implemented with appropriate hardware, software, firmware or combination thereof.

In response to host reads of encoded data from the memory device 200, e.g., NAND flash memory, at step 501, hard decoding is performed on a codeword and fails, and as a result regular, i.e., unenhanced, LDPC soft decoding is also performed. The assumption here is that hard decoding failed. If hard decoding was successful, further decoding is unnecessary.

At step 502, it is determined whether or not the LDPC soft decoding performed at step 501 succeeded or failed. If it is determined that such soft decoding succeeded, the flow ends, as indicated by block 503. On the other hand, if it is determined that such soft decoding failed, then interference correction is applied as described above, and as indicated at step 504.

That is, at step 504, neighbor-assisted interference correction based on the current LLR value of the select bit, as well as LLR values of bits of neighboring bit line and word line intersections is applied. Such correction is obtained using the quantizer 145 optimized to generate $\overline{Y_1^k}$ values. The $\overline{Y_1^k}$ values are input into the LDPC decoder 135, which performs LDPC soft decoding again with the information obtained in the interference correction.

At step 505, a determination is made as to whether this first level enhanced LDPC soft decoding was successful or not. If it is determined that such decoding was successful, the flow ends (block 503). If it is determined that such decoding was not successful, the flow proceeds to step 506, where the neighbor-assisted interference correction is applied using the deep learning (DL) model. Then, second level enhanced LDPC soft decoding is performed using the additional information obtained from application of the DL model. Such soft decoding is performed until successful up to a maximum number of iterations.

At step 507, it is determined whether this second level enhanced LDPC soft decoding performed in step 506 was successful or not. The determination of step 507 may be made after each iteration of the LDPC decoding performed in step 506, in which case the determination includes not only whether decoding at that iteration succeeded or failed but also whether that iteration is equal to the maximum number of iterations. Thus, if the determination is that the decoding for a given iteration was unsuccessful but that the maximum number of iterations has not been reached, then the flow returns to step 506 for another iteration of the second level enhanced LDPC soft decoding. At some point in the loop of steps 506 and 507, a determination will be made at step 507 that this decoding was successful or that the maximum number of iterations have been performed, in which case the process ends, represented by block 503.

Figure 6:
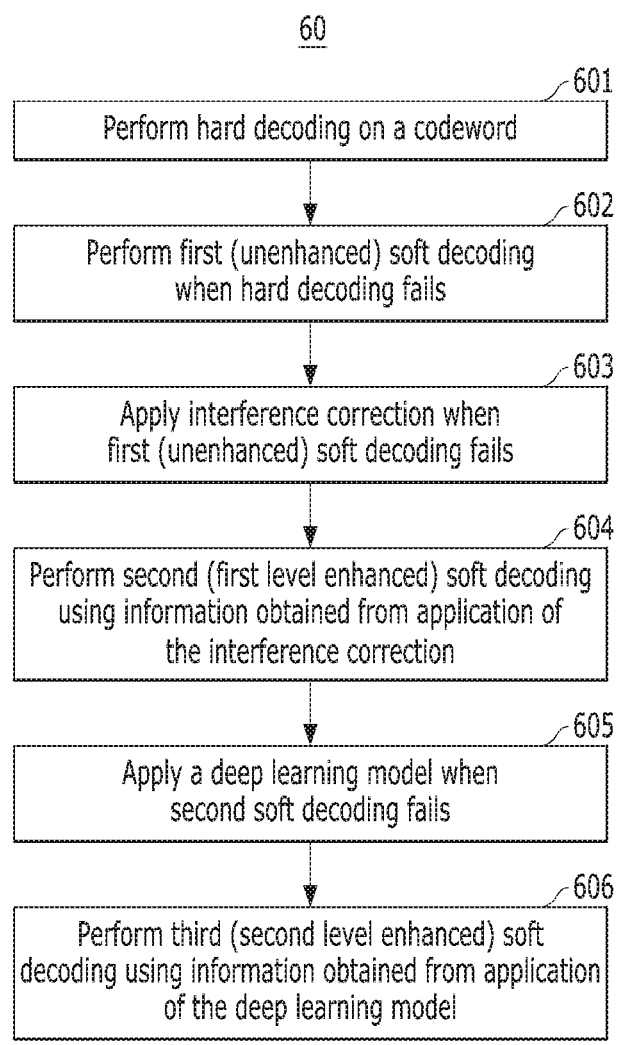
FIG. 6 is a flow chart illustrating steps in processes for low-density parity-check (LDPC) decoding in accordance with embodiments of the present invention.

FIG. 6 is a flow chart describing steps in processes for LDPC decoding with multi-level interference correction capability, in accordance with embodiments of the present invention. The steps shown in flow chart 60 are exemplary. Those skilled in the art will understand that additional and/or alternative steps may be performed, or that the order of steps may be changed, to effectuate aspects of the present invention without departing from the inventive concepts disclosed herein.

A codeword for decoding is received from the memory device 200, e.g., NAND flash memory, for decoding. At step 601, hard decoding is performed. When that fails, first soft decoding is performed at step 602. This first soft decoding may be unenhanced soft decoding.

If this first soft decoding fails, the method proceeds to step 603 where interference correction is applied. The interference correction is applied as explained above, e.g., in connection with step 504 of FIG. 5.

At step 604, second soft decoding is performed. This second soft decoding (which is first level enhanced soft decoding) uses information obtained from application of the interference correction in step 603.

If the second soft decoding fails, the method proceeds to step 605 where a deep learning model is applied. The deep learning model is applied as previously explained.

At step 606, third soft decoding is performed. This third soft decoding (which is second level enhanced soft decoding) uses information obtained from application of the deep learning model. Multiple iterations of the third (second level enhanced) soft decoding are performed at step 606 as needed up to a maximum number of iterations, as previously explained.

Although not shown in FIG. 6, if decoding is successful after the hard decoding (step 601), first soft decoding (step 602), or second soft decoding (step 604), the decoding ends.

As the foregoing demonstrates, embodiments of the present invention provide improved LDPC decoding techniques, which employ multi-level interference correction capability, to provide an improved estimate of the LLR value for a particular bit using LLR values for other bits of local word line/bit line intersections. As a result, embodiments of the present invention provide an improved LDPC decoder and decoding process.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
   a decoder configured to perform first soft decoding to generate log-likelihood ratio (LLR) values of a bit and bits of memory cells neighboring a memory cell of the bit; and
   a quantizer configured to obtain an estimated LLR value of the bit based on the LLR values of the bit and the bits of the memory cells neighboring the memory cell of the bit, when the first soft decoding fails, wherein
   the decoder is further configured to
   perform second soft decoding using the estimated LLR value, when the first soft decoding fails, and
   perform third soft decoding using information obtained from application of a deep learning model to provide a more accurate estimate of the LLR value of the bit, when the second soft decoding fails.

2. The memory controller of claim 1, wherein the decoder performs the third soft decoding to provide the more accurate estimate of the LLR value of the bit based on information on the bits of the memory cells neighboring the memory cell of the bit that is generated by the decoder in the second soft decoding.

3. The memory controller of claim 2, wherein the deep learning model is trained on failed bits.

4. The memory controller of claim 3, the deep learning model is based on a function that minimizes cross-entropy between a genie LLR for the bit and an output of the function.

5. The memory controller of claim 1, wherein the quantizer is optimized based on code information for the bit.

6. The memory controller of claim 5, wherein the code information includes a number of unsatisfied checks connected to the bit and degree of the bit.

7. The memory controller of claim 5, wherein the quantizer is optimized by maximizing information between a variable denoting a correct input value for the bit and a variable representing a range of desired quantized values for the decoder.

8. The memory controller of claim 1, wherein the decoder is further configured to perform hard decoding before performing the first soft decoding.

9. The memory controller of claim 1, wherein the decoder comprises a low-density parity-check (LDPC) decoder.

10. A memory system, comprising:
    a memory device including a memory cell array of memory cells formed at intersections of bit lines and word lines; and
    a memory controller comprising
    a decoder configured to perform first soft decoding to generate log-likelihood ratio (LLR) values of a bit and bits of memory cells neighboring a memory cell of the bit, and
    a quantizer configured to obtain an estimated LLR value of the bit based on the LLR values of the bit and the bits of the memory cells neighboring the memory cell of the bit, when the first soft decoding fails, wherein
    the decoder is further configured to
    perform second soft decoding using the estimated LLR value, when the first soft decoding fails, and
    perform third soft decoding using information obtained from application of a deep learning model to provide a more accurate estimate of the LLR value of the bit, when the second soft decoding fails.

11. A method of decoding, the method comprising:
    performing first soft decoding of a codeword to generate log-likelihood ratio (LLR) values of a bit and bits of memory cells neighboring a memory cell of the bit;
    applying interference correction to obtain an estimated LLR value of the bit using information on the bits of the memory cells neighboring the memory cell of the bit obtained during the first soft decoding, when the first soft decoding fails;
    performing second soft decoding of the codeword using the estimated LLR value obtained by applying interference correction;
    applying a deep learning model to provide a more accurate estimate of the LLR value of the bit when the second decoding fails; and
    performing third soft decoding of the codeword using the more accurate estimated LLR value of the bit obtained by applying the deep learning model.

12. The method of claim 11, wherein the third soft decoding to obtain the more accurate estimate of the LLR value of the bit is performed based on information on the bits of the memory cells neighboring the memory cell of the bit that is generated in the performing of the second soft decoding.

13. The method of claim 11, wherein the interference correction is applied using an optimized quantizer.

14. The method of claim 13, further comprising:
   optimizing the quantizer based on code information for the bit.

15. The method of claim 14, wherein the code information includes a number of unsatisfied checks connected to the bit and degree of the bit.

16. The method of claim 11, further comprising:
   training the deep learning model on failed bits.

17. The method of claim 16, wherein the deep learning model is based on a function that minimizes cross-entropy between a genie LLR for the bit and an output of the function.

18. The method of claim 11, further comprising:
   performing hard decoding of the codeword before performing the first soft decoding.

19. The method of claim 11, wherein each of the first, second and third soft decoding comprises low-density parity-check (LDPC) soft decoding.

\* \* \* \* \*